(12) United States Patent
Park et al.

(10) Patent No.: US 8,907,229 B2
(45) Date of Patent: Dec. 9, 2014

(54) EMI SHIELDING GASKET

(75) Inventors: In-Kil Park, Yongin-Si (KR); Dae Kyum Kim, Incheon (KR)

(73) Assignee: Innochips Technology Co., Ltd. (KR)

( * ) Notice: Subject to any disclaimer, the term of this patent is extended or adjusted under 35 U.S.C. 154(b) by 314 days.

(21) Appl. No.: 13/273,254

(22) Filed: Oct. 14, 2011

(65) Prior Publication Data

US 2012/0090886 A1    Apr. 19, 2012

(30) Foreign Application Priority Data

Oct. 14, 2010    (KR) ......................... 10-2010-0100439

(51) Int. Cl.
   H05K 9/00    (2006.01)
   H01R 4/00    (2006.01)
   H05K 3/34    (2006.01)

(52) U.S. Cl.
   CPC .... H05K 3/3431 (2013.01); *H05K 2201/10371* (2013.01); H05K 9/0015 (2013.01)
   USPC ............................ 174/358; 174/366; 174/370

(58) Field of Classification Search
   CPC ... H05K 9/003; H05K 9/0015; H05K 9/0016; H05K 9/0022
   USPC ........................................ 174/358, 366, 370
   See application file for complete search history.

(56) References Cited

U.S. PATENT DOCUMENTS

| | | | | |
|---|---|---|---|---|
| 4,857,668 A | * | 8/1989 | Buonanno | 174/354 |
| 5,147,121 A | * | 9/1992 | McIlwraith | 312/296 |
| 5,250,751 A | * | 10/1993 | Yamaguchi | 174/354 |
| 5,522,602 A | * | 6/1996 | Kaplo et al. | 277/650 |
| 5,901,046 A | * | 5/1999 | Ohta et al. | 361/760 |
| 6,235,986 B1 | * | 5/2001 | Reis et al. | 174/358 |
| 6,255,581 B1 | * | 7/2001 | Reis et al. | 174/388 |
| 6,439,115 B1 | * | 8/2002 | Michiels et al. | 101/129 |
| 6,525,267 B1 | * | 2/2003 | Worley et al. | 174/370 |
| 6,541,698 B2 | * | 4/2003 | Miska | 174/358 |
| 6,563,044 B2 | * | 5/2003 | Ducros et al. | 174/358 |
| 6,568,583 B2 | * | 5/2003 | Yumi et al. | 228/180.5 |
| 6,570,776 B2 | * | 5/2003 | MacDonald et al. | 361/818 |
| 6,613,976 B1 | * | 9/2003 | Benn, Jr. | 174/358 |

(Continued)

FOREIGN PATENT DOCUMENTS

| JP | 57040804 A | * | 3/1982 |
|---|---|---|---|
| JP | 04116884 A | * | 4/1992 |

(Continued)

OTHER PUBLICATIONS

Extended European Search Report for EP11184583.0, mailed Apr. 9, 2014.

*Primary Examiner* — Jeremy C Norris
*Assistant Examiner* — Nathan Milakovich

(57) ABSTRACT

Provided is an electromagnetic interference shielding gasket, which includes an elastomer, a soldering prevention part disposed in at least one region of a side surface and a bottom surface of the elastomer, and an electrode disposed on the bottom surface of the elastomer. Even when solder cream for attaching the EMI shielding gasket to a printed circuit board is pushed from the bottom surface of the EMI shielding gasket by its surface tension and solder-rising, the solder cream stays in the soldering prevention part without moving upward along the side surface of the EMI shielding gasket. Accordingly, the reliability of soldering can be ensured without sacrificing elastic resilient force of the EMI shielding gasket.

11 Claims, 9 Drawing Sheets

(a)

(b)

(c)

(56) References Cited

U.S. PATENT DOCUMENTS

| | | | | |
|---|---|---|---|---|
| 6,646,199 B2* | 11/2003 | Botrie | | 174/358 |
| 6,653,556 B2* | 11/2003 | Kim | | 174/358 |
| 6,696,639 B1* | 2/2004 | Nurmi | | 174/363 |
| 6,818,822 B1* | 11/2004 | Gilliland et al. | | 174/357 |
| 6,901,660 B2* | 6/2005 | Miska | | 29/846 |
| 6,943,288 B1* | 9/2005 | Miska | | 174/388 |
| 6,986,669 B2* | 1/2006 | Kawai | | 439/66 |
| 7,129,421 B2* | 10/2006 | Reis et al. | | 174/354 |
| 7,402,761 B2* | 7/2008 | Kim | | 174/357 |
| 7,591,666 B2* | 9/2009 | Legrady et al. | | 439/424 |
| 7,763,810 B2* | 7/2010 | van Haaster | | 174/357 |
| 7,771,213 B2* | 8/2010 | Kim et al. | | 439/83 |
| 7,791,895 B2* | 9/2010 | Sun | | 361/760 |
| 7,889,515 B2* | 2/2011 | Boetto et al. | | 361/818 |
| 8,378,228 B2* | 2/2013 | Sun | | 174/261 |
| 8,461,455 B2* | 6/2013 | Kim | | 174/126.2 |
| 2005/0202723 A1 | 9/2005 | Arnold et al. | | |
| 2006/0103081 A1 | 5/2006 | Dietrich et al. | | |
| 2006/0180348 A1 | 8/2006 | Cloutier et al. | | |
| 2008/0078574 A1* | 4/2008 | Kang et al. | | 174/358 |
| 2008/0083562 A1* | 4/2008 | Kuczynski et al. | | 174/350 |
| 2009/0008431 A1* | 1/2009 | Zonvide et al. | | 228/179.1 |
| 2009/0227127 A1* | 9/2009 | Kim et al. | | 439/78 |
| 2009/0244878 A1 | 10/2009 | Wurzel et al. | | |
| 2012/0090885 A1* | 4/2012 | Park et al. | | 174/358 |

FOREIGN PATENT DOCUMENTS

| | | | |
|---|---|---|---|
| KR | 2009094991 A | * | 9/2009 |
| KR | 2010024580 A | * | 3/2010 |
| KR | 1020100041975 A | | 4/2010 |
| KR | 1020100082627 A | | 7/2010 |
| KR | 20100105102 A | | 9/2010 |
| KR | 1020100098871 A | | 9/2010 |
| KR | 2010116367 A | * | 11/2010 |
| WO | 9922556 A | | 5/1999 |
| WO | 2008004741 A | | 1/2008 |
| WO | 2009110653 A | | 9/2009 |

* cited by examiner

FIG. 1
(a) 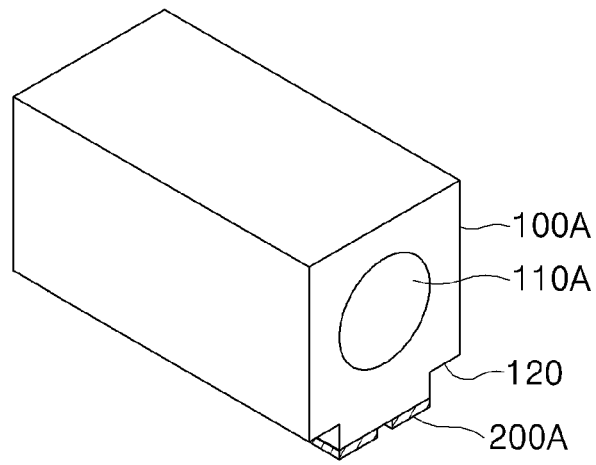
(b) 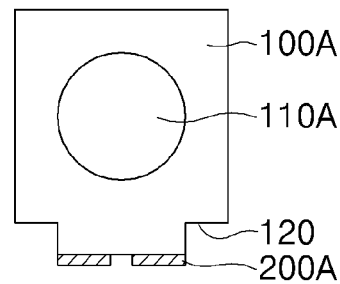
(c) 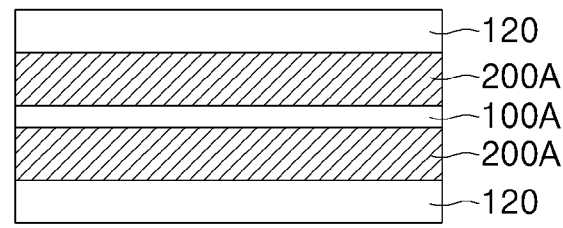

FIG. 2
(a)
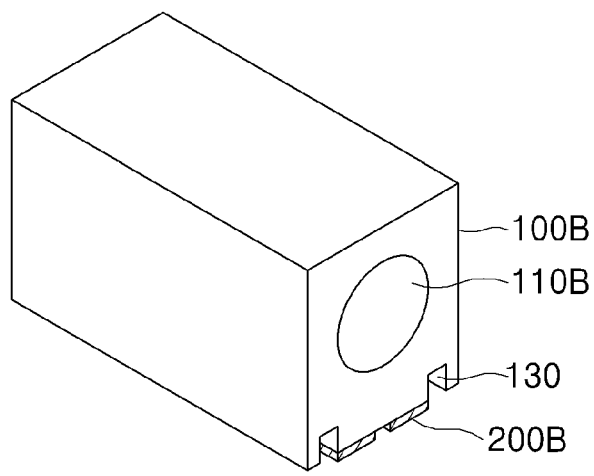
(b)
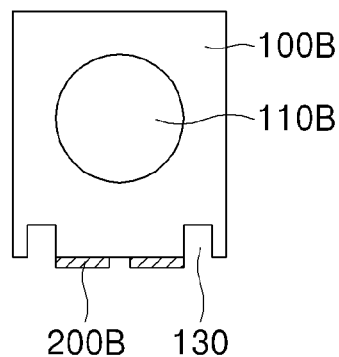

FIG. 5
(a) 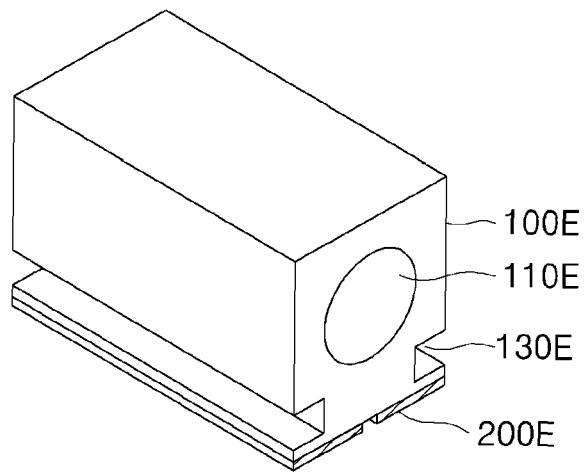
(b) 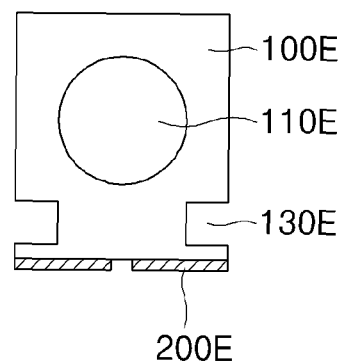

FIG. 7
(a) 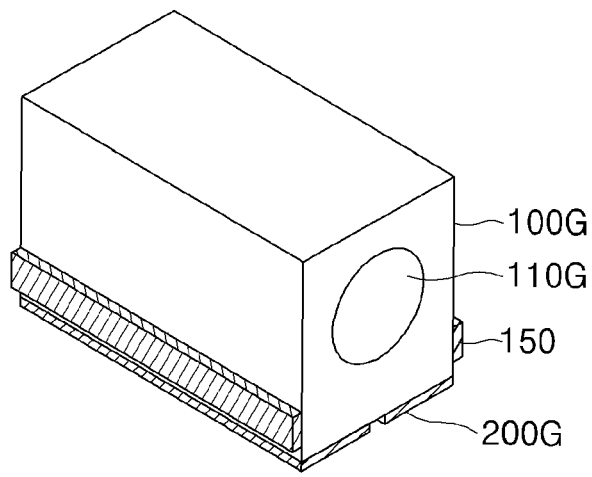
(b) 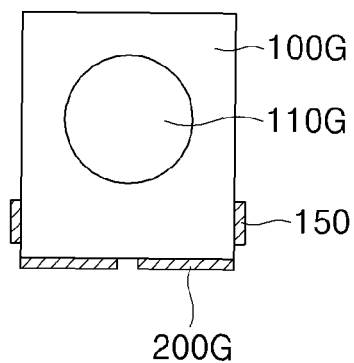

FIG. 8
(a)
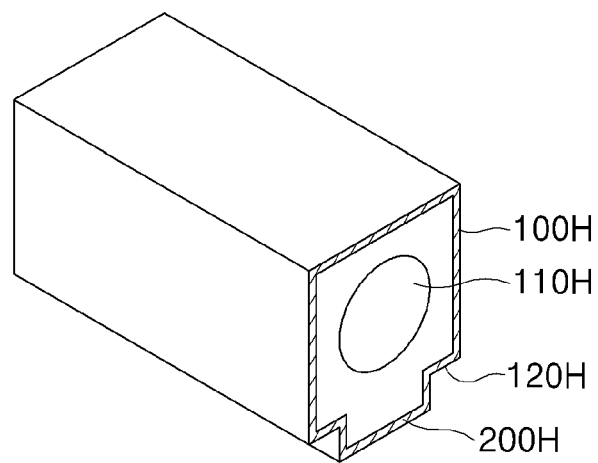
(b)
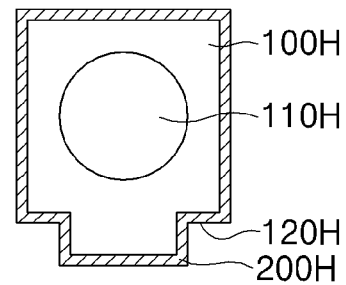

FIG. 9
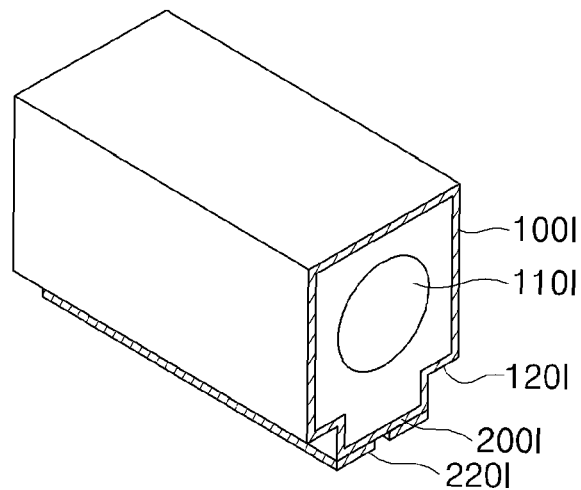
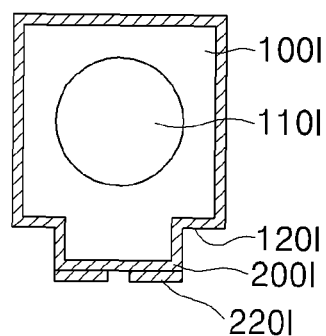

EMI SHIELDING GASKET

CROSS-REFERENCE TO RELATED APPLICATION

This application claims priority to Korean Patent Application No. 10-2010-0100439 filed on Oct. 14, 2011 and all the benefits accruing therefrom under 35 U.S.C. §119, the contents of which are incorporated by reference in their entirety.

BACKGROUND

The present disclosure relates to an electromagnetic interference (EMI) shielding gasket, and more particularly, to an EMI shielding gasket for a surface mount technology (SMT).

Electromagnetic waves may be emitted outward from a circuit of electronic devices through the atmosphere, or be transmitted through an electric wire. Various electromagnetic waves generated from a circuit of an electronic device may degrade the performance of peripheral electronic devices, make noise with peripheral electronic devices, damage an image formed by peripheral electronic devices, decrease the service life of peripheral electronic devices, and cause a defect in peripheral electronic devices. Furthermore, such electromagnetic waves may affect human bodies.

EMI shielding gaskets are used to address these issues. EMI shielding gaskets are disposed within a gap of a panel, a terminal, or a case of electronic devices such as mobile phones, LCD monitors, and computers, to prevent electromagnetic waves from being emitted from the electronic devices. As electronic devices are miniaturized, EMI shielding gaskets may be attached through surface mount on a printed circuit board (PCB). Such EMI shielding gaskets for a surface mount technology are required to have high electrical conductivity, excellent soldering properties, high heat resistance, and excellent elastic resilient characteristics.

To mount an EMI shielding gasket on a printed circuit board through surface mount, solder cream is applied to the EMI shielding gasket, then, the EMI shielding gasket is positioned to contact the printed circuit board, and then, a reflow process is performed. At this point, the solder cream is melted to have low viscosity, and is moved up to a portion of the side surface of the EMI shielding gasket by its surface tension and solder-rising during the reflow process, and thus, the portion of the side surface of the EMI shielding gasket is soldered.

In this case, since the soldered portion of the EMI shielding gasket is fixed, elasticity of the soldered portion is decreased, and thus, elastic resilient force of the EMI shielding gasket is entirely decreased. Thus, the thickness of an electronic product may be increased according to a decreased amount of the elastic resilient force of the EMI shielding gasket.

In addition, when the solder cream is moved up to the portion of the side surface of the EMI shielding gasket, and the portion of the side surface is soldered, the amount of solder cream between the printed circuit board and the bottom surface of the EMI shielding gasket is reduced, and thus, the EMI shielding gasket comes off the printed circuit board, thereby causing a defect such as soldering failure. To address these issues, the amount of the solder cream is increased, and thus, its costs are increased.

SUMMARY

The present disclosure provides an EMI shielding gasket that ensures elastic resilient force even after surface mount.

The present disclosure also provides an EMI shielding gasket that prevents solder cream from moving upward along a side surface of the EMI shielding gasket, thereby preventing the side surface from being soldered.

The present disclosure also provides an EMI shielding gasket, which includes a trench or recess in at least one region of side and bottom surfaces of an elastomer, or a soldering prevention layer on the side surface, to prevent solder cream from moving upward along a side surface of the EMI shielding gasket, thereby preventing the side surface from being soldered.

In accordance with an exemplary embodiment, an electromagnetic interference shielding gasket includes: an elastomer; a soldering prevention part disposed in at least one region of a side surface and a bottom surface of the elastomer; and a conductive layer disposed in at least one region of the elastomer.

The electromagnetic interference shielding gasket may further include a hole that passes through the elastomer from a front surface of the elastomer to a rear surface thereof.

The soldering prevention part may include a stepped part disposed between the side surface and the bottom surface of the elastomer. The soldering prevention part may include a trench disposed in at least one of the side surface and the bottom surface of the elastomer. The soldering prevention part may include at least one recess disposed in at least one of the side surface and the bottom surface of the elastomer.

The soldering prevention part may include: a stepped part disposed between the side surface and the bottom surface of the elastomer; and a trench and at least one recess in at least one of the side surface and the bottom surface of the elastomer.

The soldering prevention part may include a soldering prevention layer disposed on at least one side surface of the elastomer.

The conductive layer may be disposed at least on the bottom and side surfaces of the elastomer, and be formed by adhering a conductive material with a conductive adhesive tape.

The conductive layer may be formed by applying paste formed of a conductive material.

The conductive layer may be partially inserted and fixed in the elastomer, and be bent along the front, rear, and bottom surfaces of the elastomer.

The conductive layer may include: a fixing part disposed in the hole; a connecting part bent downward from the fixing part along the front and rear surfaces of the elastomer; and a contact part bent from the connecting part along the bottom surface of the elastomer.

BRIEF DESCRIPTION OF THE DRAWINGS

Exemplary embodiments can be understood in more detail from the following description taken in conjunction with the accompanying drawings, in which:

FIG. 1A is a perspective view illustrating an electromagnetic interference (EMI) shielding gasket in accordance with an exemplary embodiment;

FIG. 1B is a front view illustrating the EMI shielding gasket of FIG. 1A;

FIG. 1C is a bottom view illustrating the EMI shielding gasket of FIG. 1B;

FIG. 2A is a perspective view illustrating an EMI shielding gasket in accordance with another exemplary embodiment;

FIG. 2B is a front view illustrating the EMI shielding gasket of FIG. 2A;

FIG. 5A is a perspective view illustrating an EMI shielding gasket in accordance with another exemplary embodiment;

FIG. 5B is a front view illustrating the EMI shielding gasket of FIG. 5A;

FIG. 7A is a perspective view illustrating an EMI shielding gasket in accordance with another exemplary embodiment;

FIG. 7B is a front view illustrating the EMI shielding gasket of FIG. 7A;

FIG. 8A is a perspective view illustrating an EMI shielding gasket in accordance with another exemplary embodiment;

FIG. 8B is a front view illustrating the EMI shielding gasket of FIG. 8A;

FIG. 9A is a perspective view illustrating an EMI shielding gasket in accordance with another exemplary embodiment; and FIG. 9B is a front view illustrating the EMI shielding gasket of FIG. 9A.

DETAILED DESCRIPTION OF EXEMPLARY EMBODIMENTS

Figure 3:
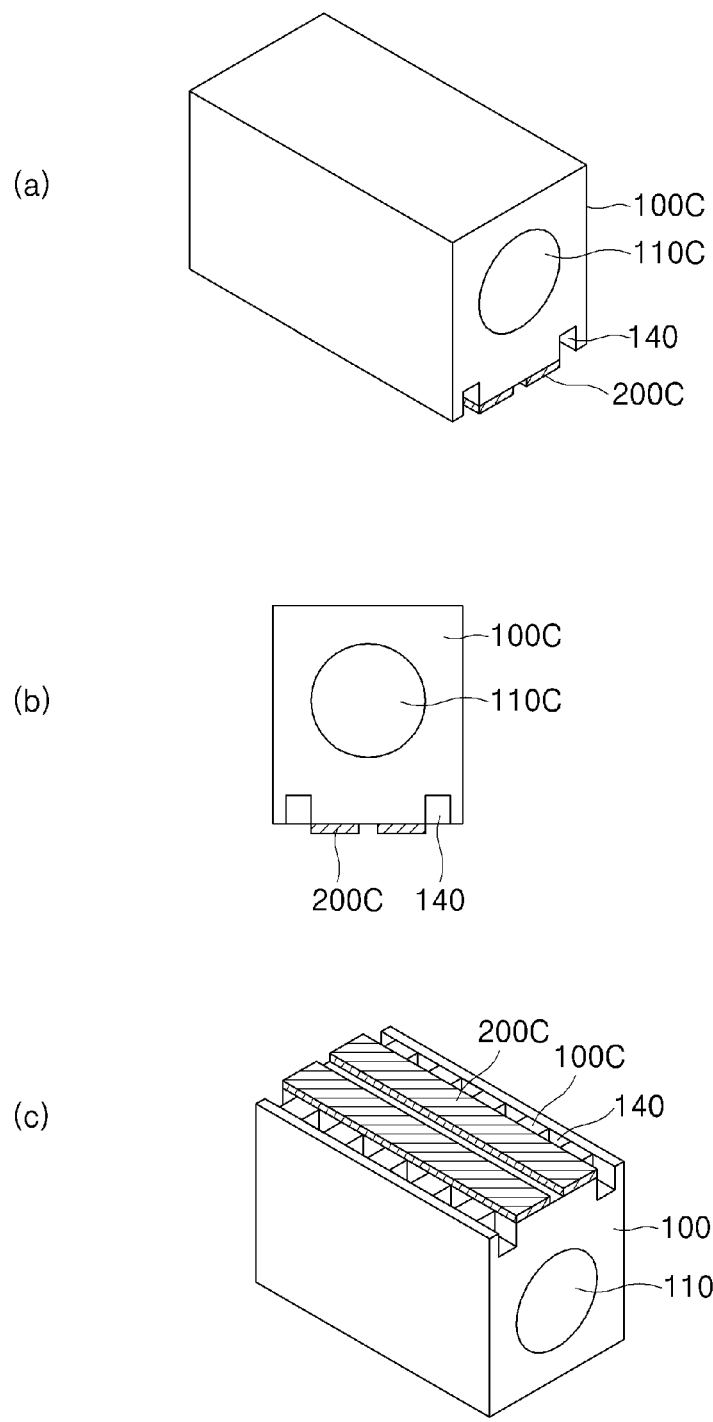
FIG. 3A is a perspective view illustrating the upper portion of an EMI shielding gasket in accordance with another exemplary embodiment.
FIG. 3B is a front view illustrating the EMI shielding gasket of FIG. 3A.
FIG. 3C is a perspective view illustrating the lower portion of the EMI shielding gasket of FIG. 3B.

Hereinafter, specific embodiments will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

FIG. 1A is a perspective view illustrating an electromagnetic interference (EMI) shielding gasket in accordance with an exemplary embodiment. FIG. 1B is a front view illustrating the EMI shielding gasket of FIG. 1A. FIG. 1C is a bottom view illustrating the EMI shielding gasket of FIG. 1B.

Referring to FIGS. 1A, 1B and 1C, the EMI shielding gasket includes an elastomer 100A and a conductive layer 200A. A hole 110A passes through the elastomer 100A from the front surface of the elastomer 100A to the rear surface thereof. Stepped parts 120 are disposed between the bottom surface of the elastomer 100A and the side surfaces thereof. The conductive layer 200A is disposed on the bottom surface of the elastomer 100A.

For example, the elastomer 100A may have a rectangular parallelepiped shape with square front and rear surfaces and rectangular side, top, and bottom surfaces. Alternatively, the elastomer 100A may be round from a portion of the side surfaces to the top surface, but is not limited thereto. In the current embodiment, the square surfaces through which the hole 110A passes are defined as the front and rear surfaces of the elastomer 100A, and the rectangular surfaces disposed at both sides of the hole 110A are defined as the side surfaces of the elastomer 100A. However, the directivities of the front, rear, and side surfaces are not limited thereto. For example, the directivities of the front, rear, and side surfaces may be determined with respect to the conductive layer 200A. The elastomer 100A may be formed of a material having predetermined elasticity. For example, the elastomer 100A may include: a polymer synthetic resin such as polyurethane foam, polyvinyl chloride (PVC), silicone, ethylene vinylacetate copolymer, and polyethylene; rubber such as natural rubber (NR), styrene butadiene rubber (SBR), ethylene propylene diene monomer (EPDM) rubber, nitrile butadiene rubber (NBR), and neoprene; solid sheets; or a sponge sheet. However, the elastomer 100A is not limited thereto, and thus, may be formed of any elastic material. The elastomer 100A may have shock and vibration absorbing properties, surface resistivity, and vertical volume resistivity. The elastomer 100A may be conductive or insulating. When the elastomer 100A is conductive, the elastomer 100A may include carbon black, graphite, gold, silver, copper, nickel, or aluminum. These materials may be formed on the surface of the elastomer 100A, or be contained in the elastomer 100A. That is, the elastomer 100A formed in advance may be coated with a conductive material, or the elastomer 100A may be formed of a mixture of an elastic material and conductive fine powder. The hole 110A may pass through the elastomer 100A from the front surface of the elastomer 100A to the rear surface thereof. The hole 110A improves the shock and vibration absorbing properties and elasticity of the elastomer 100A. The hole 110A may have an approximately circular shape, or a tetragonal shape, but is not limited thereto. Since the elastomer 100A has elasticity, the hole 110 may be removed. The elastomer 100A may be provided with soldering prevention parts that prevent solder cream from moving upward along the side surfaces of the EMI shielding gasket in a reflow process for surface mount. The soldering prevention parts may be provided by forming the stepped parts 120 between the bottom surface of the elastomer 100A and the side surfaces thereof. Accordingly, even though a portion of solder cream is pushed by its surface tension toward both sides of the conductive layer 200A in a reflow process, the solder cream is collected in spaces defined by the stepped parts 120, and thus, the solder cream is prevented from moving upward along the side surfaces of the EMI shielding gasket.

The conductive layer 200A is disposed on the bottom surface of the elastomer 100A where the EMI shielding gasket contacts a printed circuit board. That is, the conductive layer 200A may be disposed entirely on the bottom surface of the elastomer 100A except for the stepped parts 120 and the middle of the bottom surface of the elastomer 100A as illustrated in FIGS. 1A, 1B and 1C. The conductive layer 200A may be formed of a conductive material including a metal such as aluminum, copper, nickel, gold, and silver, or be formed by adhering a conductive adhesive tape (not shown) to the elastomer 100A. Alternatively, the conductive layer 200A may be formed by applying conductive paste including a metal. In this case, while the elastomer 100A is formed through injection molding, the conductive layer 200A may be formed from the conductive paste.

As described above, the EMI shielding gasket includes the stepped parts 120 between the bottom surface and the side surfaces of the elastomer 100A to prevent solder cream from moving upward along the side surfaces of the EMI shielding gasket in a reflow process for surface mount.

FIG. 2A is a perspective view illustrating an EMI shielding gasket in accordance with another exemplary embodiment. FIG. 2B is a front view illustrating the EMI shielding gasket of FIG. 2A.

Referring to FIGS. 2A and 2B, the EMI shielding gasket includes trenches 130 in the bottom surface of an elastomer 100B. For example, a conductive layer 200B may extend in the longitudinal direction of the elastomer 100B in the middle of the bottom surface of the elastomer 100B, and the trenches 130 may be disposed out of the conductive layer 200B. The trenches 130 may extend along the conductive layer 200B, and have a predetermined depth from the bottom surface of the elastomer 100B. Accordingly, solder cream stays in the trenches 130 during a reflow process, and thus, the solder cream is prevented from being soldered to the side surfaces of the elastomer 100B.

Referring to FIGS. 3A, 3B and 3C, recesses 140 are disposed in the bottom surface of an elastomer 100C. One of the recesses 140 may be disposed in the bottom surface of the elastomer 100C out of a conductive layer 200C, or the recesses 140 may be spaced a predetermined distance from each other in the bottom surface of the elastomer 100C. The recesses 140 may have a predetermined shape such as a circular or tetragonal shape. Accordingly, solder cream stays in the recesses 140 during a reflow process, and thus, the solder cream is prevented from being soldered to the side surfaces of the elastomer 100C.

Figure 4:
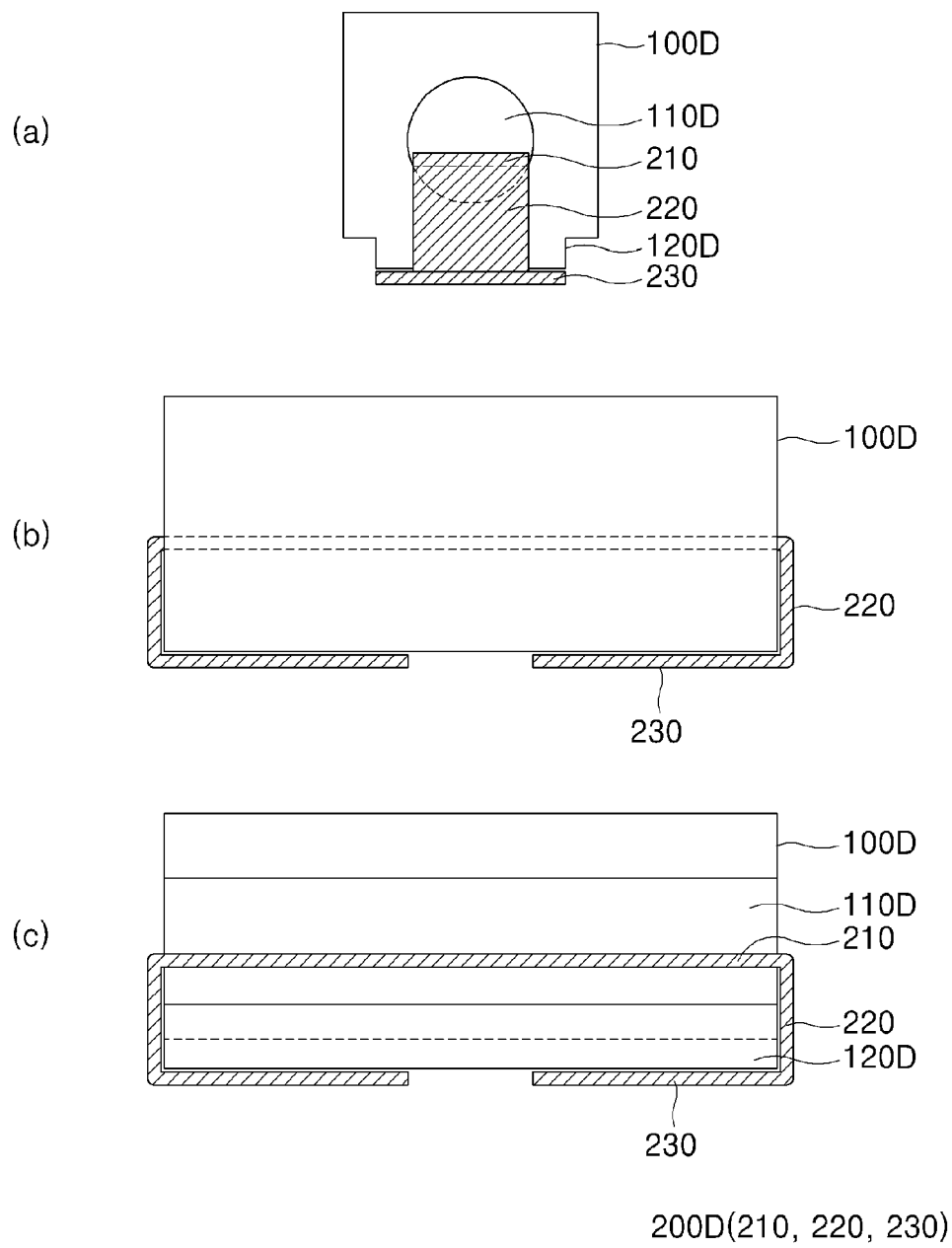
FIG. 4A is a front view illustrating an EMI shielding gasket in accordance with another exemplary embodiment.
FIG. 4B is a side view illustrating the EMI shielding gasket of FIG. 4A.
FIG. 4C is a cross-sectional view illustrating the EMI shielding gasket of FIG. 4B.

FIG. 4A is a front view illustrating an EMI shielding gasket in accordance with another exemplary embodiment. FIG. 4B is a side view illustrating the EMI shielding gasket of FIG. 4A. FIG. 4C is a cross-sectional view illustrating the EMI shielding gasket of FIG. 4B.

Referring to FIGS. 4A, 4B and 4C, the EMI shielding gasket includes an elastomer 100 and a conductive layer 200. A hole 110 passes through the elastomer 100 from the front surface of the elastomer 100 to the rear surface thereof. Stepped parts 120 as soldering prevention parts are disposed in at least one region between the bottom surface of the elastomer 100 and the side surfaces thereof. The conductive layer 200 passes through the hole 110 of the elastomer 100, is fixed to and supported by the elastomer 100, and extends down to the bottom surface of the elastomer 100 along the side surfaces of the elastomer 100.

The elastomer 100 may be formed of an elastic material such that the hole 110 passes through the elastomer 100 from the front surface to the rear surface, and the stepped parts 120 are disposed between the bottom surface and the side surfaces. The stepped parts 120 prevent solder cream from moving upward along the side surfaces of the EMI shielding gasket in a reflow process for surface mount.

Referring to FIGS. 4A, 4B and 4C, the EMI shielding gasket includes an elastomer 100D and a conductive layer 200D. A hole 110D passes through the elastomer 100D from the front surface of the elastomer 100D to the rear surface thereof. Stepped parts 120D as soldering prevention parts are disposed in at least one region between the bottom surface of the elastomer 100D and the side surfaces thereof. The conductive layer 200D passes through the hole 110D of the elastomer 100D, is fixed to and supported by the elastomer 100D, and extends down to the bottom surface of the elastomer 100D along the side surfaces of the elastomer 100D.

The elastomer 100D may be formed of an elastic material such that the hole 110D passes through the elastomer 100D from the front surface to the rear surface, and the stepped parts 120D are disposed between the bottom surface and the side surfaces. The stepped parts 120D prevent solder cream from moving upward along the side surfaces of the EMI shielding gasket in a reflow process for surface mount.

The conductive layer 200D passing through the hole 110D is exposed out of the elastomer 100D, and exposed portions of the conductive layer 200D are bent along the front, rear, and bottom surfaces of the elastomer 100D. That is, the conductive layer 200D includes a fixing part 210 disposed in the hole 110D of the elastomer 100D, a plurality of connecting parts 220 bent downward from both ends of the fixing part 210 along the front and rear surfaces of the elastomer 100D, and a plurality of contact parts 230 bent from ends of the connecting parts 220 along the bottom surface of the elastomer 100D. The contact parts 230 contact and are fixed through surface mount to a device such as a printed circuit board. The fixing part 210 is disposed in the elastomer 100D to fix the conductive layer 200, thereby preventing a removal of the conductive layer 200D from the elastomer 100D. The connecting parts 220 connect the fixing part 210 to the contact parts 230. Although the conductive layer 200D is divided into the fixing part 210, the connecting parts 220, and the contact parts 230, the fixing part 210, the connecting parts 220, and the contact parts 230 may be integrally formed of the same material. The conductive layer 200D may be formed of a conductive material with a predetermined width. The fixing part 210 inserted in the hole 110D has a width equal to or smaller than the diameter of the hole 110D. The connecting parts 220 and the contact parts 230 disposed out of the hole 110D may have a width equal to the width of the elastomer 100D except for the stepped parts 120D. The conductive layer 200D may be formed of a conductive material including a metal such as aluminum, copper, nickel, gold, and silver. Alternatively, the conductive layer 200D may be formed by plating a fiber sheet with a metal, to thereby have flexibility.

FIG. 5A is a perspective view illustrating an EMI shielding gasket in accordance with another exemplary embodiment. FIG. 5B is a front view illustrating the EMI shielding gasket of FIG. 5A. Referring to FIGS. 5A and 5B, trenches 130E may be disposed in the lower portions of the side surfaces of an elastomer 100E. The trenches 130E may extend in a straight line shape in the longitudinal direction of the elastomer 100E. As such, when the trenches 130E are disposed in the side surfaces of the elastomer 100E, solder cream moving upward along the side surfaces of the elastomer 100E in a reflow process stays in the trenches 130E and is hardened. Thus, the EMI shielding gasket is fixed at a portion of the side surfaces of the elastomer 100E as well as at the bottom surface of the elastomer 100E, thereby attaching the EMI shielding gasket more securely. In this case, if the trenches 130E are disposed at a height equal to or greater than that of the hole 110E, elastic resilient force of the EMI shielding gasket may be reduced. Thus, the trenches 130E are disposed lower than the hole 110E.

Figure 6:
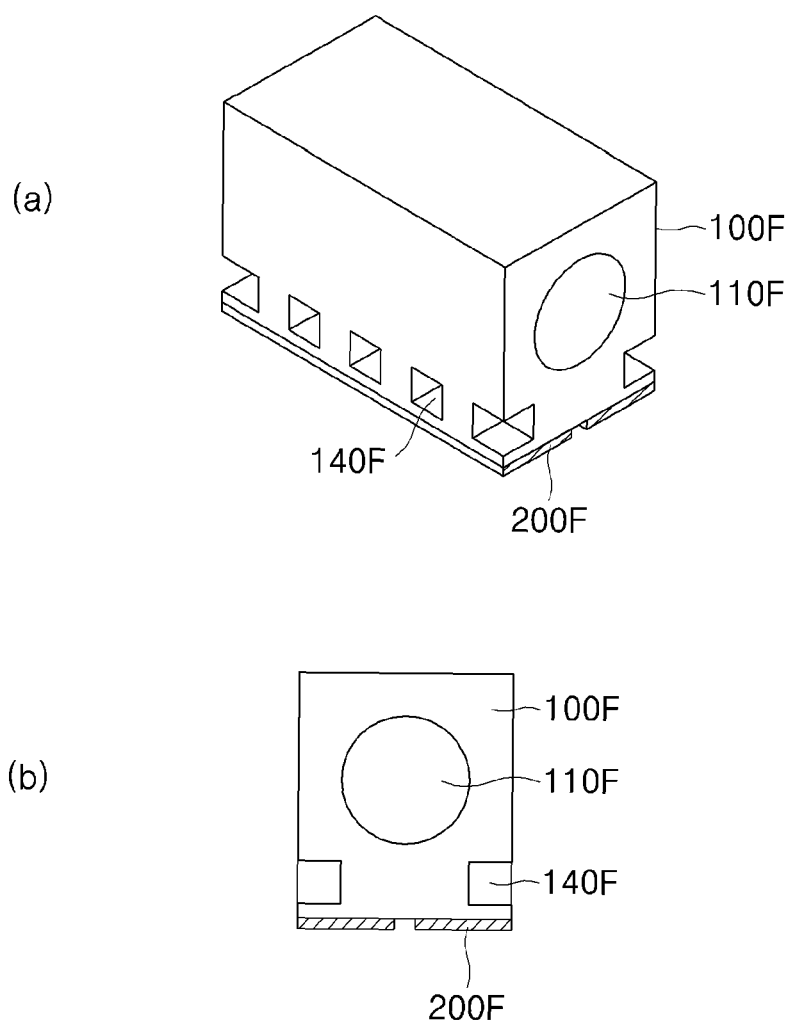
FIG. 6A is a perspective view illustrating an EMI shielding gasket in accordance with another exemplary embodiment.
FIG. 6B is a front view illustrating the EMI shielding gasket of FIG. 6A.

FIG. 6A is a perspective view illustrating an EMI shielding gasket in accordance with another exemplary embodiment. FIG. 6B is a front view illustrating the EMI shielding gasket of FIG. 6A. Referring to FIGS. 6A and 6B, one or more recesses 140F are disposed in the side surfaces of an elastomer 100F. One of the recesses 140F may be disposed in the side surface of the elastomer 100F along a conductive layer 200F, or the recesses 140F may be spaced a predetermined distance from each other in the side surface of the elastomer 100F. The recesses 140F may have a predetermined shape such as a circular or tetragonal shape.

In accordance with the above embodiments, the soldering prevention part are provided by forming at least one of the stepped parts 120, 120D, the trenches 130, 130E, and the recesses 140, 140F in at least one region of the side and bottom surfaces of the elastomer 100F. Alternatively, referring to FIGS. 7A and 7B, soldering prevention layers 150 may be formed on the side surfaces of an elastomer 100G to prevent solder cream from moving upward along the side surfaces of the elastomer 100G. The soldering prevention layers 150 may have a thickness ranging from approximately 0.01 mm to approximately 0.2 mm, and be formed of one of a heat-resistant polymer layer, a flexible heat-resistant polymer tape, and a heat-resistant elastic coating material such as polyimide Teflon, Teflon tape, or silicone rubber. In this case, when the soldering prevention layers 150 are disposed on the side surfaces of the elastomer 100G, the stepped part 120, 120D, the trench 130, 130E or at least one of the recesses 140, 140F may be disposed in the bottom surface of the elastomer 100G.

In accordance with the above-described embodiments, the conductive layer 200A 200, 200C, 200D, 200E, 200F or 200G is disposed on the bottom surface of the elastomer 100G, and the soldering prevention part is disposed in at least one region of the elastomer 100G. Alternatively, a conductive layer 200A, 200, 200C, 200D, 200E, 200F or 200G may surround an elastomer 100G. That is, referring to FIG. 8, the conductive layer 200H may be disposed on at least one portion of the bottom and side surfaces of the elastomer 100H, or be disposed on all of the surfaces of the elastomer 100H including the front, rear, bottom, and top surfaces thereof. To form the conductive layer 200H, a conductive material including a metal such as aluminum, copper, nickel, gold, and silver may be adhered to the elastomer 100H through an adhesion member such as an adhesive tape, or a conductive adhesion tape including a conductive material may be adhered to the elastomer 100H. Alternatively, the conductive layer 200H may be formed by applying conductive paste including a metal to surround the elastomer 100H. In this case, while the elastomer 100H is formed through injection molding, the conductive layer 200H may be formed from the conductive paste. Alternatively, referring to FIG. 9, a first conductive layer 200I may be disposed on at least one portion of an elastomer 100I including a portion of the bottom and side surfaces of the elastomer 100I, and a second conductive layer 220I may be disposed under the bottom surface of the elastomer 100I. That is, if only the first conductive layer 200I is disposed on the elastomer 100I, a surface mount process may be incompletely performed. To improve reliability of the surface mount process, the second conductive layer 220I may be disposed under the bottom surface of the elastomer 100I.

In accordance with the embodiments, at least one trench or recess is disposed in at least one of the bottom and side surfaces of the elastomer. In addition, the soldering prevention layer such as silicone rubber may be disposed on at least one of the bottom and side surfaces of the elastomer.

In accordance with the embodiments, even when solder cream for attaching the EMI shielding gasket to a printed circuit board is pushed from the bottom surface of the EMI shielding gasket by its surface tension and solder-rising, the solder cream stays in the trench or recess without moving upward along the side surface of the EMI shielding gasket, or is prevented from moving upward by the soldering prevention layer. Accordingly, the reliability of soldering can be ensured without sacrificing the elastic resilient force of the EMI shielding gasket. In addition, since solder cream is soldered to fix a portion of the side surfaces of the EMI shielding gasket, the EMI shielding gasket can be fixed more securely.

Although the EMI shielding gasket has been described with reference to the specific exemplary embodiments, it is not limited thereto. Therefore, it will be readily understood by those skilled in the art that various modifications and changes can be made thereto without departing from the spirit and scope of the present invention defined by the appended claims.

What is claimed is:

1. An electromagnetic interference shielding gasket for blocking outward emission of electromagnetic waves generated from electronic devices comprising:
    an elastomer having a hole that passes through the elastomer from a front surface of the elastomer to a rear surface thereof; and
    a soldering prevention part disposed in at least one region of a side surface and a bottom surface of the elastomer to prevent a solder cream from moving upward along the side surface of the elastomer during reflow; and
    a conductive layer disposed in at least one region of the elastomer,
    wherein the soldering prevention part is formed by removing at least one region of the side surface and the bottom surface of the elastomer.

2. The electromagnetic interference shielding gasket of claim 1, wherein the soldering prevention part comprises a stepped part disposed between the side surface and the bottom surface of the elastomer.

3. The electromagnetic interference shielding gasket of claim 1, wherein the soldering prevention part comprises a trench disposed in at least one of the side surface and the bottom surface of the elastomer.

4. The electromagnetic interference shielding gasket of claim 1, wherein the soldering prevention part comprises at least one recess disposed in at least one of the side surface and the bottom surface of the elastomer.

5. The electromagnetic interference shielding gasket of claim 1, wherein the soldering prevention part comprises:
    a stepped part disposed between the side surface and the bottom surface of the elastomer; and
    a trench and at least one recess in at least one of the side surface and the bottom surface of the elastomer.

6. The electromagnetic interference shielding gasket of claim 5, wherein the soldering prevention part further comprises a soldering prevention layer disposed on at least one side surface of the elastomer.

7. The electromagnetic interference shielding gasket of claim 1, wherein the soldering prevention part comprises a soldering prevention layer disposed on at least one side surface of the elastomer.

8. The electromagnetic interference shielding gasket of claim 1, wherein the conductive layer is disposed at least on the bottom and side surfaces of the elastomer, and is formed by adhering a conductive material with an adhesive member.

9. The electromagnetic interference shielding gasket of claim 1, wherein the conductive layer is formed by applying paste formed of a conductive material.

10. The electromagnetic interference shielding gasket of claim 1, wherein the conductive layer is partially inserted and fixed in the elastomer, and is bent along the front, rear, and bottom surfaces of the elastomer.

11. The electromagnetic interference shielding gasket of claim 10, wherein the conductive layer comprises:
    a fixing part disposed in the hole;
    a connecting part bent downward from the fixing part along the front and rear surfaces of the elastomer; and
    a contact part bent from the connecting part along the bottom surface of the elastomer.

* * * * *